United States Patent [19]
Chillara et al.

[11] Patent Number: 5,498,901
[45] Date of Patent: Mar. 12, 1996

[54] LEAD FRAME HAVING LAYERED CONDUCTIVE PLANES

[75] Inventors: Satya Chillara; Shahram Mostafazadeh, both of San Jose, Calif.

[73] Assignee: National Semiconductor Corporation, Santa Clara, Calif.

[21] Appl. No.: 294,323

[22] Filed: Aug. 23, 1994

[51] Int. Cl.$^6$ ............................................. H01L 23/495
[52] U.S. Cl. ..................... 257/666; 257/672; 257/674
[58] Field of Search ........................... 257/666, 671, 257/672, 674, 668, 676, 692, 697, 787, 691, 700

[56] References Cited

U.S. PATENT DOCUMENTS

| | | | |
|---|---|---|---|
| 4,451,845 | 5/1984 | Philofsky et al. | 257/703 |
| 4,891,687 | 1/1990 | Mallik et al. | 357/70 |
| 5,025,114 | 6/1991 | Braden | 174/52.4 |
| 5,089,878 | 2/1992 | Lee | 257/666 |
| 5,168,368 | 12/1992 | Gow, III et al. | 257/668 |
| 5,194,695 | 3/1993 | Maslakow | 437/209 |

Primary Examiner—Sara W. Crane
Assistant Examiner—Jhihan Clark
Attorney, Agent, or Firm—Hickman & Beyer

[57] ABSTRACT

A lead frame having layered conductive planes is disclosed for use in semiconductor devices. The lead frame includes a plurality of long leads each having a lead tip and a plurality of short leads. Electrically conductive layers are attached to the long leads around such that they don't cover the tips of the long leads and are radially inward of the short leads. The conductive layers are insulated from the long lead and each other by adhesive insulating layers. In a preferred embodiment, the top conductive layer has a smaller width than the bottom conducting layer and is positioned to expose an inner and outer ledge on the bottom conducting layer. The exposed outer ledge allows bonding to the shorter leads. The use of shorter leads decreases the amount of inductance in the leads. The conductive layers also may act as capacitors. In one embodiment of the present application the short leads may correspond to ground and/or power leads. The decreased inductance and increased capacitance decreases the impedance seen in the power and ground leads. This allows the semiconductor to operate at higher speeds and consume less power.

25 Claims, 4 Drawing Sheets

5,498,901

LEAD FRAME HAVING LAYERED CONDUCTIVE PLANES

BACKGROUND OF THE INVENTION

This invention relates generally to lead frames for use in integrated circuit packaging and more particularly, a lead frame having one or more layered conductive planes thereon is described.

Referring to FIG. 1, a conventional lead frame 10 generally includes a die pad 17, die pad support arms 15 and leads 11 having lead tips 12 which circumscribe the die. In the manufacture of conventional lead frames the die pad 17, support arms 15 and long leads 11 and lead tips 12 are typically formed from a single metal strip. The lead forming step may be either an etching process or a stamping process. In these processes the areas between the leads 11 are removed through either stamping or etching. The area between the leads 11 and the lead tips 12 are usually referred to as slots 14. In the etching process, a mask of the pattern of leads, die pad and support arms is laid over a metal strip. The exposed areas are then etched away creating the slots 14 between the leads. The stamping process usually consists of stamping out the slots 14 between the leads, die pad 17 and support arms 15. Multiple stamp tool punches, shaped in the form of the respective slots 14, punch out the slots 14.

The support arms 15 extend out from the die pad to support the die pad during handling. An integrated circuit is placed on the die pad 17, in the center of the lead frame 10. After the leads 11, die pad 17 and support arms 15 are formed, the lead frame 10 may be annealed to strengthen and relieve stress on the leads and support arms. This may be followed by plating the lead tips 12 with an electrically conductive material. Plating also allows for better bonding to the bonding wires when the leads are connected to the integrated circuit.

The leads may then be taped with an adhesive strip to keep the leads from moving during handling. The adhesive strip may be a single picture frame style strip that is placed across the leads. An alternative is the application of separate strips placed across a set of leads. The former process allows for better tolerances when the tape either shrinks or expands causing the leads to move. Then, the lead frame 10 may be trimmed to free the lead tips 12 from the die pad 17.

After trimming, the lead frame is ready to be packaged. An integrated circuit is placed on the die pad 17 and bonded to the lead tips 12 with bonding wires. The inner portion of the lead frame 20 is then encapsulated with an encapsulating material. The excess metal that supported the entire lead frame 22 is then trimmed away to free the long leads 11 from each other. The end product is a packaged semiconductor device.

A current problem with conventional lead frames is the frequency response of the leads. The length of the leads introduce inductance in the power and ground leads. The longer the ground and power leads the greater the inductance. The inductance in turn increases the amount of power consumption in a semiconductor package. The length also make the power and ground leads susceptible to noise from neighboring leads. The increased inductance makes the lead frame and the connected integrated circuit susceptible to power surges and drops. The inductance hampers efforts to reduce internal and external noise. Decoupling capacitors applied across the ground and power pins are often used to alleviate these problems. The decoupling capacitors help to filter out noise from the power supply and neighboring devices as well as protect against sudden power surges and drops. Semiconductor packages having a large number of pins may require two to three decoupling capacitors. The capacitors are a significant cost in products utilizing large integrated circuits.

Ideally, the frequency response of the power and ground leads should be a low pass filter. By decreasing the inductance in the power and ground leads and increasing the capacitance between the power and ground leads a better frequency response can be obtained. The improved frequency response will allow a semiconductor package to operate at high speeds. Also, the impedance of the leads are reduced which decreases power consumption.

U.S. Pat. No. 4,891,687 to Mallik et al., discloses the use of a multilayer molded plastic integrated circuit package to obtain a compact package which had the side benefit of reducing inductance and increasing capacitance in the power and ground leads. Mallik teaches the use of a pair of intricate conducting layers with specialized tabs that are bonded to the leads of an otherwise ordinary lead frame that does not include a die pad. The specialized tabs taught in Mallik also requires that the conductive layers be precisely attached to the lead frame so the tabs align with particular leads on the lead frame. The tabs must then be bonded using relatively expensive non-standard bonding techniques. Mallik also requires that the integrated circuit be placed directly on the lower conductive layer.

SUMMARY OF THE INVENTION

The present invention provides a lead frame with multiple layers that reduces inductance in the power and ground leads and also increases the capacitance between the power and ground leads. The advantages of the present invention will become apparent to those skilled in the art upon a reading of the following description of a multilayer lead frame and a study of the several figures of the drawings. In one embodiment a multilayer lead frame includes long leads each having a lead tip, short leads with lead pads, a die area and an additional electrically conductive layer that may be a power, ground or signal layer placed over the long leads with an electrically insulating layer. The lead tips of the long leads and the lead pads are kept exposed so the lead tips may be electrically coupled to an integrated circuit die positioned in the die area and the lead pads may be electrically coupled to the conductive layer. The short leads terminate at locations radially outward of the conductive layer. An insulating layer is sandwiched between the electrically conductive layer and the long leads for electrically insulating the long leads from the conductive layer. The shorter length of the short leads decreases the amount of inductance in the short leads.

In one embodiment a pair of electrically conductive layer may be used, which may, for example, correspond to power and ground layers. The conductive layers are stacked with an electrically insulating layer therebetween. The second conductive layer has a smaller width than the first conductive layer and is placed over the first conductive layer. This leaves an inner ledge and an outer ledge of the first layer exposed. The inner ledge is electrically connected to associated bonding pads of an integrated circuit die. The outer ledge is electrically connected to the lead pads of the corresponding short leads. The second layer is also electrically connected to associated bonding pads and the lead pads. The electrical connections may be made with conventional bonding wires. The bonding pads and lead pads connected to a layer correspond to the layer they are connected to. For example, if the first layer is a ground plane layer then the bonding pads and the short leads connected to the ground plane layer are ground pads and ground leads, respectively. Thus, the conductive layers act as planar conductors.

The conductive layers, in one embodiment, may correspond to ground and power planes. By having the power and ground planes separated by an insulator increases the capacitance between the power and ground planes. Thus, the short leads reduces inductance and the conductive planes increases capacitance in the power and ground leads. Decreased inductance and increased capacitance reduces the impedance in the power and ground leads. This improves the speed and power consumption of a semiconductor device using a lead frame having conductive layers with short leads.

BRIEF DESCRIPTION OF THE DRAWINGS

The present invention may best be understood by reference to the following description taken in conjunction with the accompanying drawings in which.

DETAILED DESCRIPTION OF THE PREFERRED EMBODIMENTS

Figure 1:
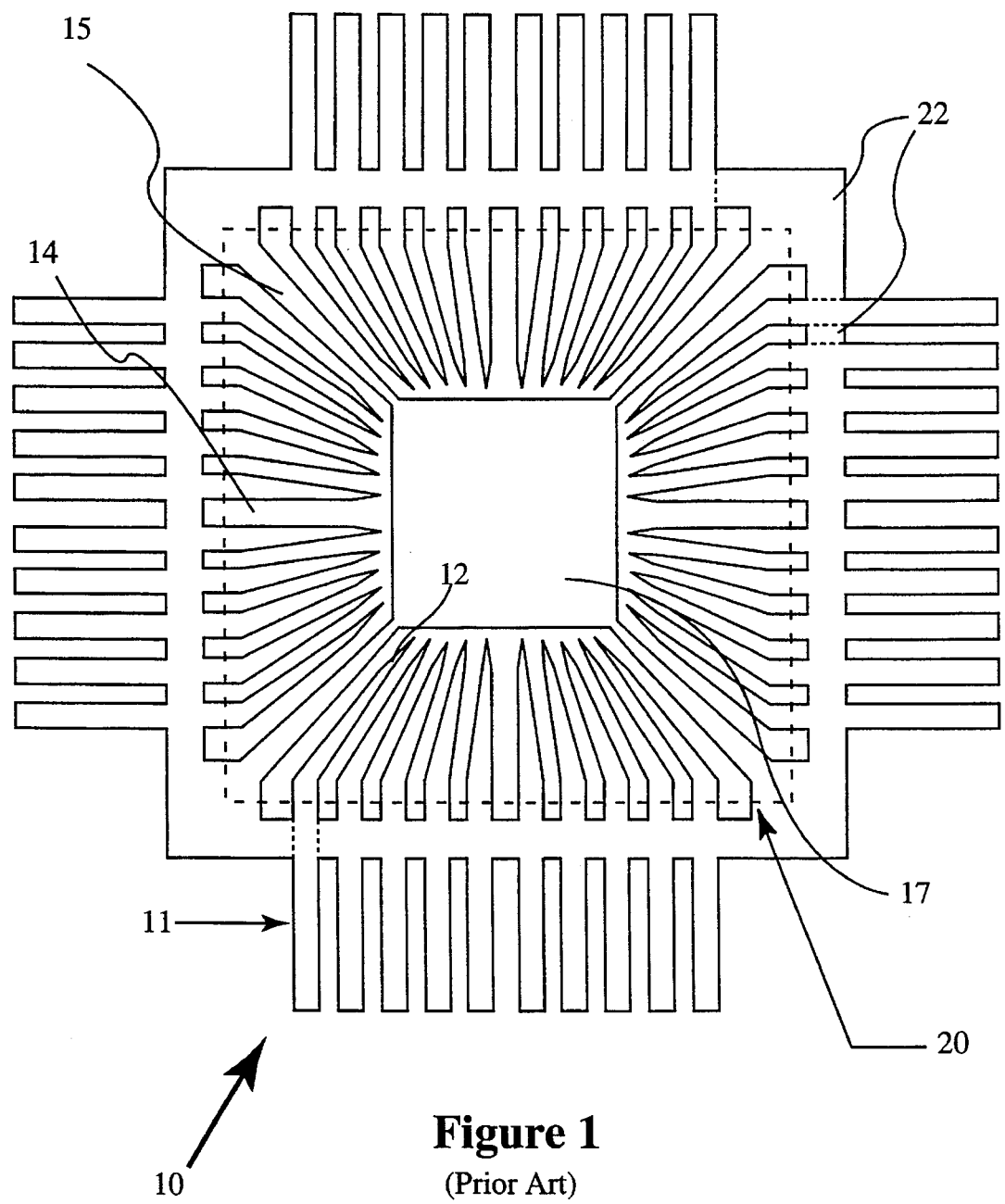
FIG. 1 is a diagrammatic top view of a conventional lead frame.
Figure 2:
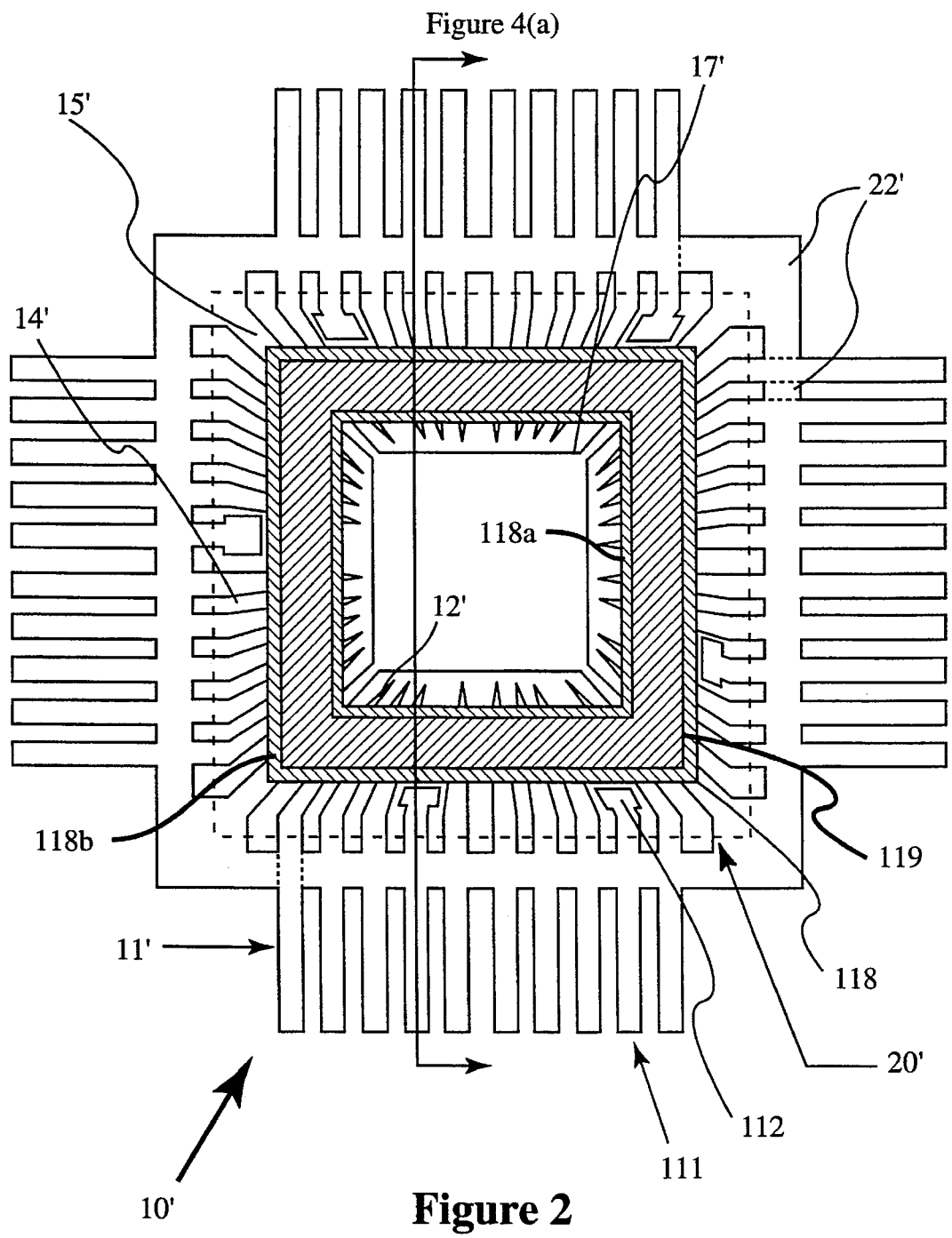
FIG. 2 is a diagrammatic top view of a multilayer lead frame in accordance with one embodiment of the present invention.

Referring initially to FIG. 2, one embodiment of the present invention will be described in more detail. In this embodiment of a multilayer lead frame 10', there are a number of long leads 11' and a plurality of short leads 111. The long leads 11' have lead tips 12' and the short leads 111 end in lead pads 112. In the embodiment shown, the lead pads are merely the tips of the short leads. They do not have any special geometry, although any suitable tip geometry may be used. The tips of the short leads are referred to as lead pads herein only to make it easier to differentiate the tips of the long leads (referred to as lead tips) and the tips of the short lead (referred to as lead pad) in the context of this application. A die pad 17' and die pad support arms 15' are shown in this particular embodiment. Of course, in alternative embodiments, the die pad 17' and the die pad support arms 15' may be omitted and an integrated circuit die may be placed in a die area at the center of the lead frame using other commonly known techniques. A first electrically conductive layer 118 that is placed over the lead tips 12' and die pad support arms 15' encircles the die area. The first electrically conductive layer 118 is placed over the long leads 11' and support arms 15' such that the it does not cover the lead tips 12'. The first electrically conductive layer 118 is positioned radially inside (i.e. closer to the die pad than) the lead pads 112 of the short leads 111, thereby leaving the entire short leads (including lead pads) 112 exposed. The short leads reduce the inductance and the conductive layers increase the capacitance between the leads connected to the conductive layer(s).

A second conductive layer 119 is stacked on top of the first conductive layer 118 and has a smaller width than the first conductive layer. This stacking is arranged to leave an inner ledge 118a and an outer ledge 118b of the first conductive layer 118 exposed. The inner ledge 118a is sized suitably to permit it to be electrically connected to associated bond pads on the integrated circuit placed on the die pad 17'. The outer ledge 118b is sized such that it may be electrically connected to the lead pads 112 of associated short leads 111. In the embodiments shown, the electrical connections are made by wire bonding and thus, the ledges are sized suitably to permit wire bonding conventional bonding wires thereto. By way of example, ledge widths that are greater than approximately 15 mils work well, although smaller ledges may be provided in some cases. The second conductive layer 119 is also sized suitably to permit it to be electrically connected to associated bond pads on the integrated circuit and the lead pads 112 of associated short leads 111.

The particular embodiment illustrated in FIG. 2 depicts the conductive layers 118 and 119 as substantially rectangular rings. However, it should be appreciated that the conductive layers 118 and 119 may take many shapes and forms in other embodiments. For example, the conductive layers 118 and 119 may be hexagonal, or ovular rings or discrete strips coupled together such that the conductive layers 118 and 119 surround the die pad 17'. Further, the conductive layers 118 and 119 may be formed in segments, semicircular or horseshoe shapes etc.

The lead pads 112, lead tips 12', die pad, 17', support arms 15', and the conductive layers 118 and 119 are located within an encapsulation region 20'. After the encapsulation region 20' of the multilayer lead frame has been encapsulated during packaging, the excess parts of the multilayer lead frame 22' are trimmed away such that the leads 11' and 111 are separated from each other and the support arms 15.

Figure 3:
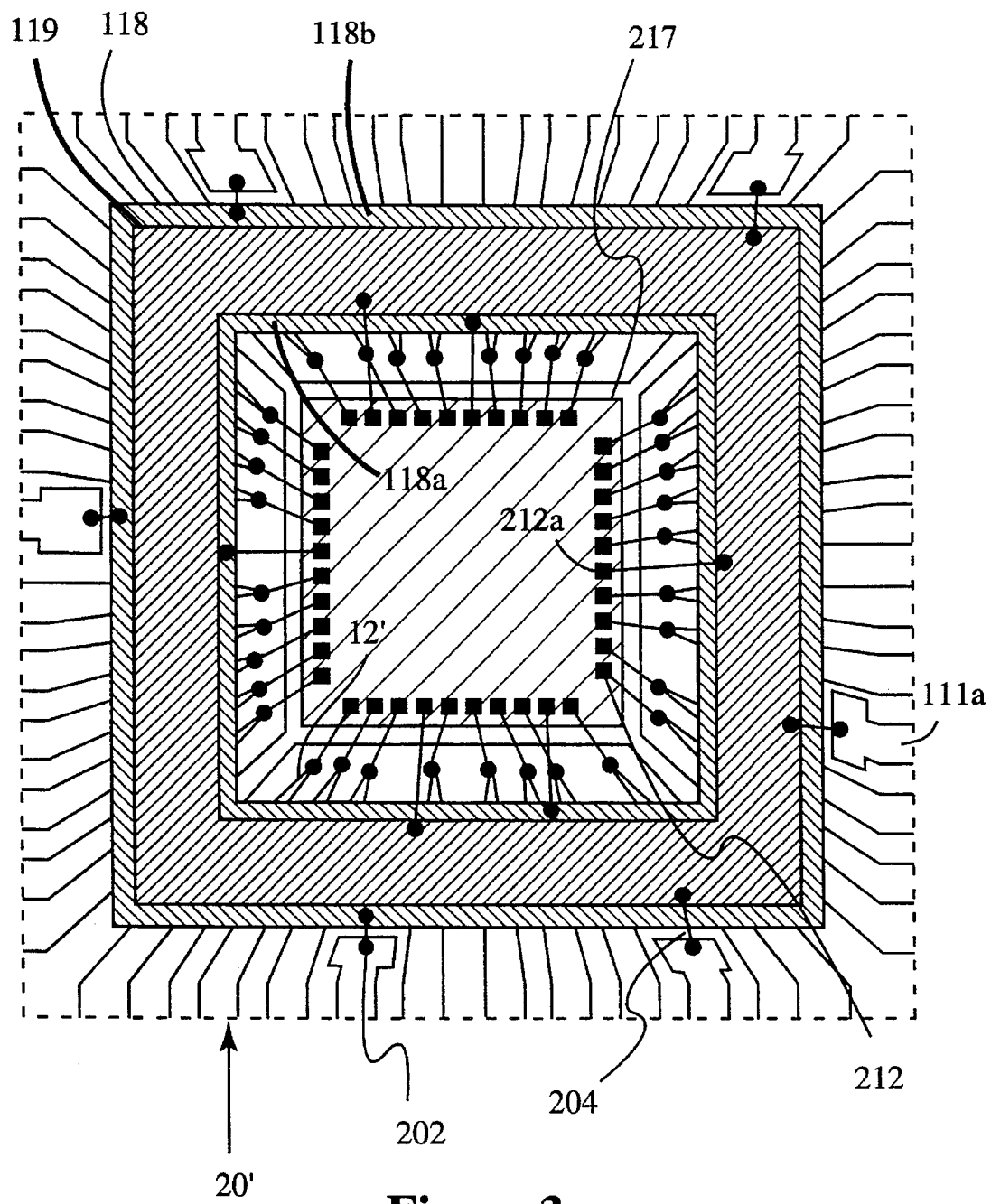
FIG. 3 is a close up diagrammatic top view of an encapsulated region of one embodiment of a multilayer lead frame with an integrated circuit die highlighting bonding wire connections.

A close up view of the encapsulation region 20' of the embodiment of a multilayer lead frame shown in FIG. 2 is illustrated in FIG. 3 after an integrated circuit die 217 has been placed on the die pad 17'. In the embodiment shown, the die 217 has bonding pads 212 positioned in rows near the periphery of its top surface. The bonding pads 212 are used to electrically couple the signal, power and ground traces on the die 217 with the outside world. More specifically, in the embodiment shown, bonding wires 204 are used to electrically couple specific bonding pads 212 with associated lead tips 12' on the lead frame 10'. Conventional wire bonding processes can be used to electrically connect the bonding pads to the lead tips. It should be appreciated, however, that other conventional electrical connection techniques such as TAB bonding may also be utilized in conjunction with the present invention.

In the embodiment shown, all the bonding pads 212 that correspond to ground on the integrated circuit die 217 are connected to the first conductive layer 118. Thus, the first conductive layer 118 effectively forms a ground plane. Similarly, all the bonding pads that correspond to power on the die 217 are connected to the second conductive layer 119. Thus, the second conductive layer 119 effectively forms a power plane. Bonding wires 204 then connect the conductive layers 118 and 119 to the associated short leads 111 through the lead pads 112. Of course, the designation of the conductive layers 118 and 119 as ground and power can be interchanged. It should be apparent that with the described structure, there is no need for the number of ground and power leads to exactly correspond to the number of bonding pads on the die that require connections to ground and power respectively. Further, since the short leads 112 are connected to the planar conductive layers 118 and 119, the connection to corresponding bonding pad(s) 212 can be made anywhere along the conductive plane 118 or 119. Thus, the location of the power and ground leads need not correspond in alignment to the location of the associated bonding pads bonding pads 212. For example in the embodiment shown in FIG. 3, one of the short power leads 111a is the third lead from the bottom of the lead frame. However, the nearest corresponding power bonding pad 212a is fifth from the bottom of the die. Thus lead assignments can be made regardless of the bonding pad assignment on an integrated circuit.

Figure 4A:
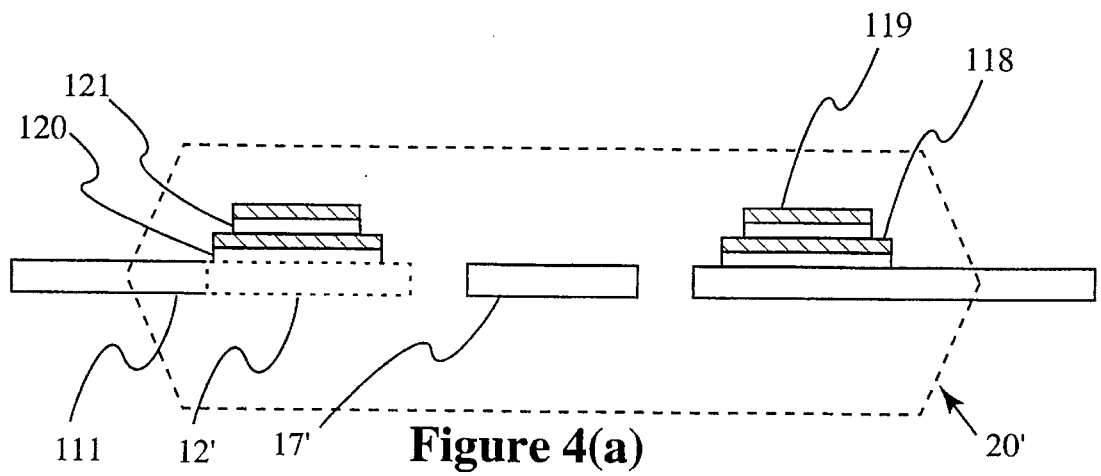
FIG. 4(a) is a diagrammatic cross-sectional view of one embodiment of a multilayer lead frame showing multiple conductive layers separated by insulating layers.
Figure 4B:
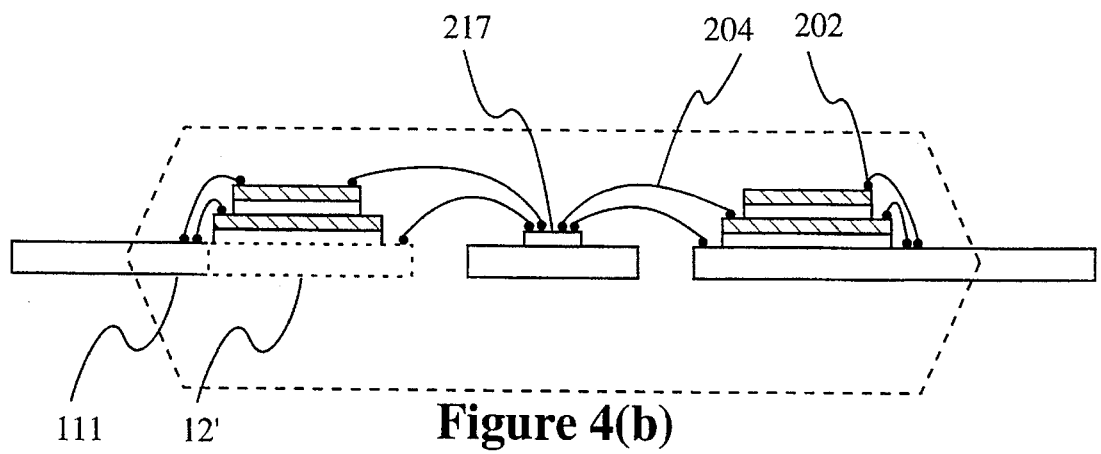
FIG. 4(b) is a diagrammatic cross-sectional view of the embodiment of a multilayer lead frame shown in FIG. 4(a) with an integrated circuit bonded to the lead frame with bonding wires.

Referring next to FIG. 4(a) a cross-sectional view of the multilayer lead frame shown in FIG. 2 is illustrated. The conductive layers 118 and 119 are parallel to one another and are electrically isolated from each other and the leads 11' and 111 by the insulating layers 120, 121 respectively. More specifically, the first conductive layer 118 is secured to the long leads 11' and support arms 15' by electrically insulating adhesive layer 120. The second conductive layer 119 is secured to the first layer 118 by insulating layer 121. Any suitable adhesive insulating material such as double sided adhesive tape or non-conductive epoxy may be used to form the insulating layers.

Figure 5:
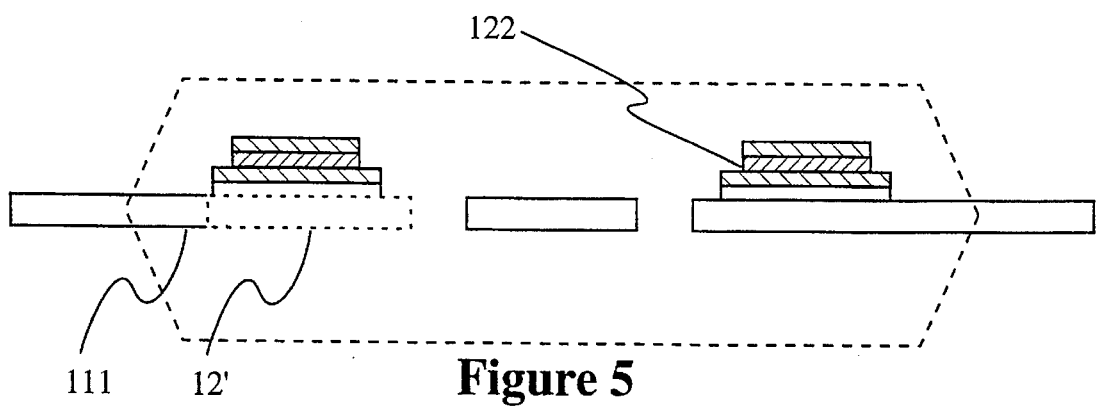
FIG. 5 is a diagrammatic cross-sectional view of a multilayer lead frame with a dielectric layer.

Since the conductive layers 118 and 119 are formed parallel to one another and are separated by an insulating layer 120, the capacitance between the leads coupled to the conductive layers 118 and 119 is increased. The capacitance can be increased further if the insulating layer 120 is also a dielectric. FIG. 5 shows an alternative embodiment utilizing a dielectric adhesive material 122.

In applications wherein the die generates a substantial amount of heat, the conductive layers 118 and 119 may also be used to assist with the distribution of heat. In such embodiments, insulating adhesive materials with good thermal conduction properties may be used in insulating layers 120 and 121.

The described multilayer lead frame is used in packaging semiconductor devices. Initially, an integrated circuit die 217 is positioned within the die area of the lead frame and attached to it support (the die attach pad in the embodiment shown) using conventional techniques. The bond pads on die 2 17 are then electrically connected to the associated leads of the lead frame and to the appropriate conductive layers 118 and 119 by wire bonding or other suitable techniques. The conductive layers 118 and 119 are then electrically connected to the appropriate short leads. After encapsulation and trimming, a finished semiconductor device package is produced. A semiconductor utilizing a multilayer lead frame exhibits improved lead frequency response providing improved speed and power consumption due to the increased capacitance and reduced inductance of the multilayer lead frame with short leads. The present invention applies to all types of semiconductor device packages such as, but not limited to, dual in line pin, lead chip carrier, quad flat pack and pin grid array packages utilizing a variety of encapsulating materials ranging from plastic and ceramic to metal.

One suitable method for manufacturing a lead frame requires in accordance with the present invention involves forming a plurality of long leads each having a lead tip and a plurality of short leads each ending in a lead pad from a metal strip. This may be done by either etching or stamping. When stamping is done, the leads 11' and 111 may then be annealed. Annealing heats the metal strip with the formed leads 11' and 111 to strengthen and relieve stresses on the leads 11' and 111. The lead tips 12' and the lead pads 212 may then be plated with a conductive coating to provide a better bonding surface. A first electrically conductive layer 118 is then adhered in place across the long leads 11' without covering the lead tips 12' or the lead pads 212 using an insulating adhesive tape that forms insulating layer 120. A second electrically conductive layer 119, having a smaller width than the first conductive layer 118, is then adhered to the top surface of the first conductive layer 118 with an insulating tape that forms insulating layer 121. The second conductive layer 119 is positioned over the first conductive layer 118 to leave exposed an inner ledge 118a and an outer ledge 118b of the first conductive layer 118. The lead frame may then be trimmed (typically after encapsulation) to remove portions of the lead frame 22' that provided structural support, thus, freeing the leads 11' and 111 from each other. To facilitate mass production, a plurality of lead frames may be formed from a single metal strip.

In one embodiment of manufacturing a semiconductor device utilizing the described multilayer lead frame, an integrated circuit die 217 is placed within a die area centrally located on the multilayer lead frame. The ground and power bond pads on the die 217 are electrically coupled to the appropriate conductive layers 118 and 119. By way of example, when the first conductive layer 118 is the ground plane, the ground bond pads 212 are wire bonded to the inner ledge 118a of the first conductive layer. The outer ledge 118b of the first conductive layer 118 is then wire bonded to the lead pads 112 of the short ground leads. Similarly, the second conductive layer 119 (which in this example takes the form of the power plane) is electrically coupled to the lead pads 112 of the short power leads 111 as well as to the power bond pads 212 on the die. The lead tips 12' are also electrically coupled to the associated bonding pads 212 of the die 217. An encapsulation region 20' is then encapsulated with a conventional encapsulating material.

Although, several embodiments of the present invention have been described in detail, it should be understood that the present invention may be embodied in many other specific forms without departing from the spirit or scope of the invention. Particularly, the conductive and insulating layers can be implemented in several different shapes and materials. The conductive layers can be any type of electrically conductive material not necessarily a metallic element. Also, more than two conductive layers can be applied in the foregoing manner or just one layer may be implemented in a particular variation of the present inventions. The conductive layers need not be constricted to ground and power designations. Another embodiment may have a conductive layer conduct a clock signal, or any other type of signal. The invention has been primarily described in conjunction with the use of bonding wires to electrically couple the die to the various leads and conductive layers. However, hybrid approaches that utilize other bonding techniques such as tape automated bonding can be used as well. It should be appreciated that future developments will likely be able to readily incorporate the advantages of the present invention as well. Therefore, the present examples are to be considered as illustrative and not restrictive, and the invention is not to be limited to the details given herein, but may be modified within the scope of appended claims.

I claim:

1. A lead frame comprising:

a plurality of leads including a plurality of long leads each having a lead tip facing a die area and a plurality of short leads each ending in a lead pad suitable for bonding, the lead pads being further from the die area than the lead tips;

a first electrically conductive layer positioned between the lead pads and the lead tips and continuously extending over a plurality of the long leads, the lead tips being exposed on a first side of the first electrically conductive layer so that the lead tips are positioned suitably for being electrically coupled to a plurality of bonding pads on a die received in the die area by wire bonding and the lead pads being exposed on a second side of the first electrically conductive layer so that the lead pads are positioned suitably for being electrically coupled to the first electrically conductive layer;

a first electrically insulating layer sandwiched between the electrically conductive layer and the long leads for electrically insulating the long leads from the conductive layer;

whereby a first set of the short leads are positioned suitably for being electrically coupled to a first set of bonding pads of the plurality of bonding pads on the die by wire bonding the first set of short leads to the first conductive layer, and wire bonding the first conductive layer to the first set of bonding pads.

2. A lead frame as recited in claim 1, further comprising:

a second electrically conductive layer positioned over the first electrically conductive layer, the second electrically conductive layer being narrower than the first electrically conductive layer; and a second electrically insulating layer sandwiched between the first and second conductive layers for electrically isolating the conductive layers, the second conductive and insulating layers being positioned such that exposed inner and outer ledges are formed on a surface of the first conductive layer that faces the second conductive layer, the exposed ledges being sized suitably to accommodate wire bonding; and whereby a second set of the short leads are positioned suitably for being electrically coupled to a second set of bonding pads of the plurality of bonding pads on the die by wire bonding the second set of short leads to the second conductive layer, and wire bonding the second conductive layer to the second set of bonding pads.

3. A lead frame as recited in claim 2 wherein the first and second electrically conductive layers and the first and second electrically insulating layers are rings.

4. A lead frame as recited in claim 2 wherein the first and second electrically conductive layers and insulating layers are substantially rectangular rings.

5. A lead frame as recited in claim 2 wherein the first and second electrically conductive layers and insulating layers are substantially ovular rings.

6. A lead frame as recited in claim 2 wherein the first and second electrically insulating layers are formed from adhesive materials suitable for respectively bonding the first conductive layer to the lead frame and the first conductive layer to the second conductive layer.

7. A packaged semiconductor comprising:

a lead frame as recited in claim 2;

an integrated circuit positioned in the die area, the integrated circuit having a plurality of bond pads;

a multiplicity of bonding wires for electrically coupling selected integrated circuit bond pads to associated long leads in the lead frame and for electrically coupling the first and second conductive layers to associated short leads and to associated bond pads, wherein none of said long leads are electrically coupled to either said first electrically conductive layer or to said second electrically conductive layer;

an encapsulating material that encapsulates the integrated circuit the bonding wires and at least a portion of the lead frame.

8. A lead frame as recited in claim 3 wherein the first and second conductive layers and the first and second insulating layers are comprised of strips.

9. A lead frame comprising:

a plurality of leads including a plurality of long leads each having a lead tip and a plurality of short leads having lead pads suitable for bonding, the lead tips of the long leads being arranged to face a die area;

a first electrically conductive layer positioned between the lead pads and the lead tips and continuously extending over a plurality of the long leads, the lead tips being exposed on a first side of the first electrically conductive layer so that the lead tips are positioned suitably for being electrically coupled to a plurality of bonding pads on a die received in the die area by wire bonding and the lead pads being exposed on a second side of the first electrically conductive layer so that the lead pads are positioned suitably for being electrically coupled to the first electrically conductive layer;

a first electrically insulating layer sandwiched between the electrically conductive layer and the long leads for electrically insulating the long leads from the conductive layer;

a second electrically conductive layer positioned over the first electrically conductive layer, the second electrically conductive layer being narrower than the first electrically conductive layer; and a second electrically insulating layer sandwiched between the first and second conductive layers for electrically isolating the conductive layers, the second conductive and insulating layers being positioned such that exposed inner and outer ledges are formed on a surface of the first conductive layer that faces the second conductive layer; and whereby the inner ledge of the first conductive layer is positioned suitably for being electrically coupled to associated bonding pads of an integrated circuit positioned in the die area and the outer ledge of the first conductive layer is positioned suitably for being electrically coupled to associated lead pads and the second conductive layer is positioned suitably for being electrically coupled to associated lead pads and to associated bonding pads of the integrated circuit die positioned in the die area.

10. A lead frame as recited in claim 9 wherein the second electrically insulating adhesive layer is a dielectric.

11. A lead frame as recited in claim 9, further comprising a dielectric layer shaped in the form of the second conductive layer that is placed between the first conductive layer and the second conductive layer and separated by the second insulating adhesive layer.

12. A lead frame as recited in claim 9, further comprising a third conductive layer and a third insulating layer, the third conductive layer being positioned over the first electrically conductive layer with the third insulating layer being interposed therebetween, the third electrically conductive layer being narrower than the second conductive layer.

13. A multilayer semiconductor as recited in claim 7, further comprising:

a die pad positioned in the die area; and a plurality of die pad support arms for supporting the die pad and wherein that the integrated circuit is adhered to the die pad.

14. A multilayer semiconductor as recited in claim 7 wherein the multilayer semiconductor is configured in a quad flat package.

15. A multilayer semiconductor as recited in claim 7 wherein the multilayer semiconductor is configured in a dual in line package.

16. A multilayer semiconductor as recited in claim 7 wherein the multilayer semiconductor is configured in a lead chip carrier package.

17. A multilayer semiconductor as recited in claim 7 wherein the multilayer semiconductor is configured in a pin grid array package.

18. A multilayer semiconductor as recited in claim 7 wherein the encapsulating material is a plastic.

19. A multilayer semiconductor as recited in claim 7 wherein the encapsulating material is a ceramic.

20. A semiconductor package comprising:

a lead frame comprising:

a plurality of leads including a plurality of long leads each having a lead tip facing a die area and a plurality of short leads each ending in a lead pad suitable for bonding, the lead pads being further from the die area than the lead tips;

a first electrically conductive layer positioned between the lead pads and the lead tips and continuously extending over a plurality of the long leads, the lead tips being exposed so as to be suitable for bonding;

a first electrically insulating layer sandwiched between the electrically conductive layer and the long leads for electrically insulating the long leads from the conductive layer;

an integrated circuit positioned in the die area of the lead frame, the integrated circuit having a plurality of bond pads; and a multiplicity of bonding wires which electrically couple selected integrated circuit bond pads to associated lead tips of long leads and which electrically couple the first conductive layer to associated short lead pads and to associated bond pads, wherein none of said long leads are electrically coupled to said first electrically conductive layer.

21. A semiconductor package as recited in claim 20, further comprising:

a second electrically conductive layer positioned over the first electrically conductive layer, the second electrically conductive layer being narrower than the first electrically conductive layer; and a second electrically insulating layer sandwiched between the first and second conductive layers for electrically isolating the conductive layers, the second conductive and insulating layers being positioned such that exposed inner and outer ledges are formed on a surface of the first conductive layer that faces the second conductive layer, the exposed ledges being sized suitably to accommodate wire bonding; and wherein said multiplicity of bonding wires includes bonding wires which electrically couple the second conductive layer to associated short lead pads and to associated bond pads.

22. A semiconductor package as recited in claim 21 wherein said first electrically conductive layer is a power conductive layer and said second electrically conductive layer is a ground conductive layer.

23. A semiconductor package as recited in claim 21 wherein said first electrically conductive layer is a ground conductive layer and said second electrically conductive layer is a power conductive layer.

24. A semiconductor package as recited in claim 21 further comprising:

a die pad positioned in the die area; and a plurality of die pad support arms for supporting the die pad and wherein the integrated circuit is adhered to the die pad.

25. A semiconductor package as recited in claim 21 further comprising:

an encapsulating material that encapsulates the integrated circuit the bonding wires and at least a portion of the lead frame.

* * * * *